(12) United States Patent
Matsuo

(10) Patent No.: US 8,743,637 B2
(45) Date of Patent: Jun. 3, 2014

(54) MEMORY DEVICE INCLUDING REDUNDANT MEMORY CELL BLOCK

(75) Inventor: Tatsuru Matsuo, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/620,280

(22) Filed: Sep. 14, 2012

(65) Prior Publication Data

US 2013/0148451 A1 Jun. 13, 2013

(30) Foreign Application Priority Data

Dec. 9, 2011 (JP) ................................. 2011-270039

(51) Int. Cl.
*G11C 29/00* (2006.01)

(52) U.S. Cl.
USPC ........................................................ 365/200

(58) Field of Classification Search
USPC ........................................................ 365/200
See application file for complete search history.

(56) References Cited

U.S. PATENT DOCUMENTS

| | | | |
|---|---|---|---|
| 6,804,156 B2 | 10/2004 | Ito | |
| 6,937,533 B2* | 8/2005 | Hojo et al. | 365/200 |
| 7,330,383 B2* | 2/2008 | Takai | 365/200 |
| 7,460,421 B2 | 12/2008 | Kohara | |
| 7,782,687 B2* | 8/2010 | Kurozumi | 365/200 |
| 7,830,710 B2* | 11/2010 | Kurozumi et al. | 365/185.09 |
| 7,908,527 B2 | 3/2011 | Kohara et al. | |
| 2004/0066684 A1 | 4/2004 | Ito | |
| 2007/0165467 A1 | 7/2007 | Kohara | |
| 2009/0044045 A1 | 2/2009 | Kohara et al. | |

FOREIGN PATENT DOCUMENTS

| | | |
|---|---|---|
| JP | 2004-133970 A | 4/2004 |
| JP | 2007-193879 A | 8/2007 |
| JP | 2008-226285 A | 9/2008 |
| JP | 2009-43328 A | 2/2009 |

OTHER PUBLICATIONS

Akhil Garg et al., "Fuse Area Reduction Based on Quantitative Yield Analysis and Effective Chip Cost", Proceedings of the 21st IEEE International Symposium on Defect and Fault-Tolerance in VLSI Systems (DFT '06) Oct. 4-6, 2006. http://ieeexplore.ieee.org/xpls/abs_all.jsp?arnumber=4030927.

* cited by examiner

Primary Examiner — Hoai V Ho
Assistant Examiner — Tri Hoang
(74) Attorney, Agent, or Firm — Arent Fox LLP

(57) ABSTRACT

A clock signal is supplied to a first repair flag flip-flop, a second repair flag flip-flop, a first repair data flip-flop group, and a second repair data flip-flop group to serially transfer a second repair flag and a first repair flag stored in a non-volatile memory to the second repair flag flip-flop and the first repair flag flip-flop. Subsequently, repair data stored in the non-volatile memory is serially output to the first repair data flip-flop group, and repair data of the first repair data flip-flop group and the second repair data flip-flop group is serially transferred.

8 Claims, 17 Drawing Sheets

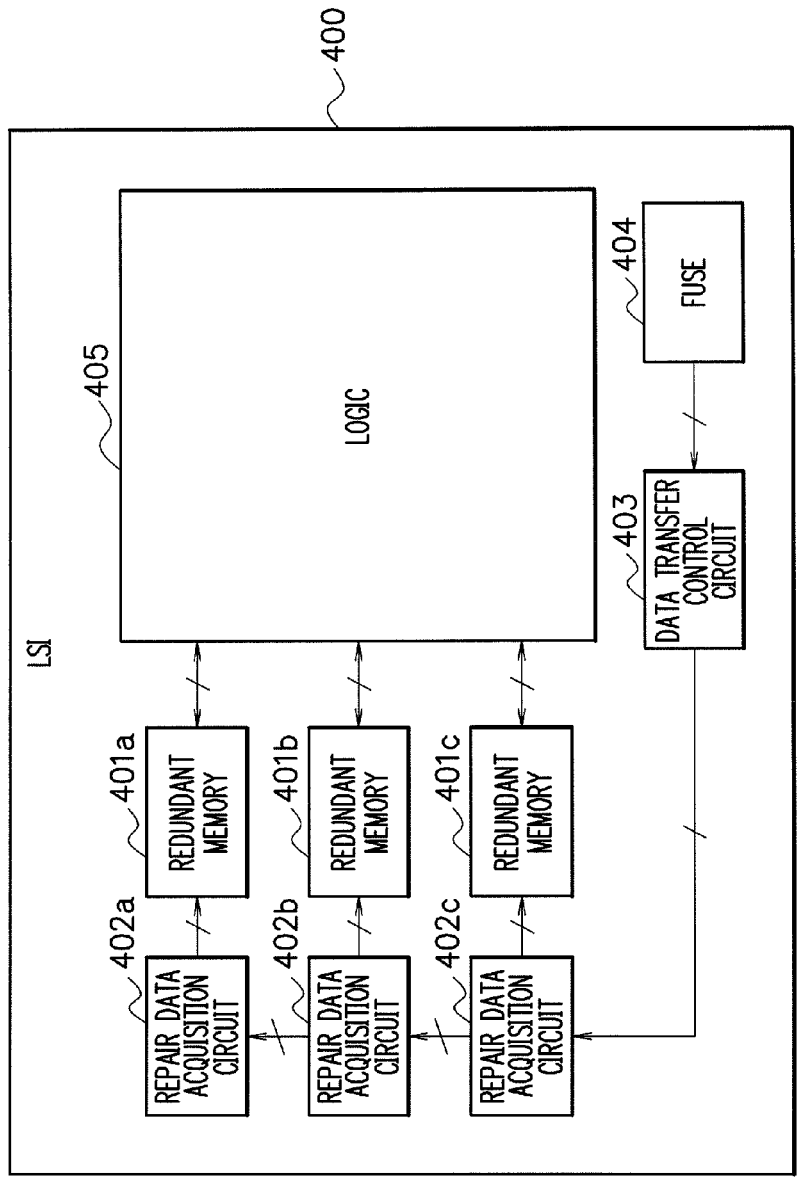
F I G. 4

F I G. 8
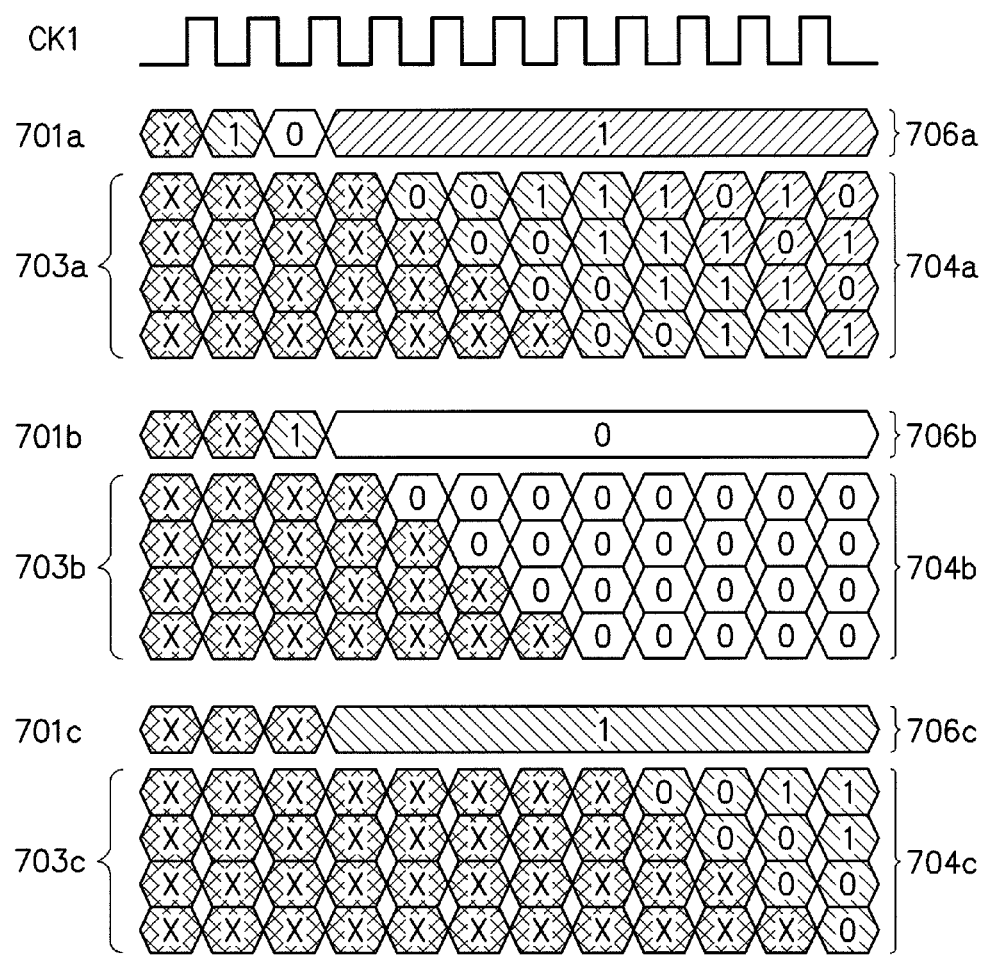

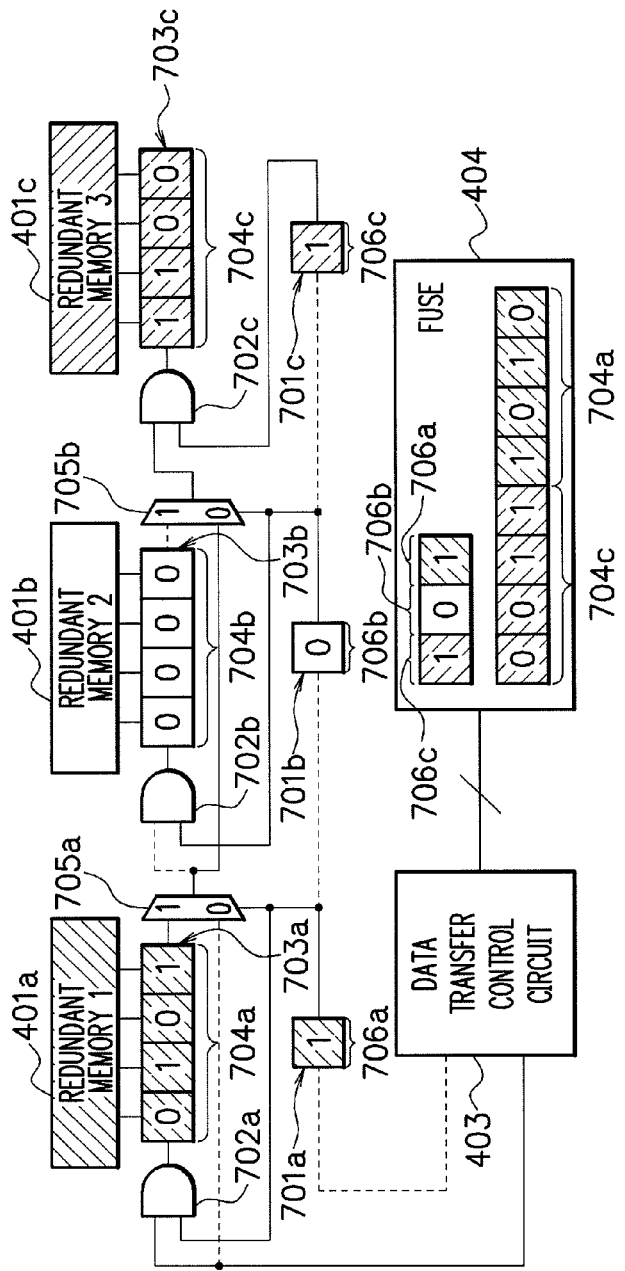
F I G. 10

F I G. 11
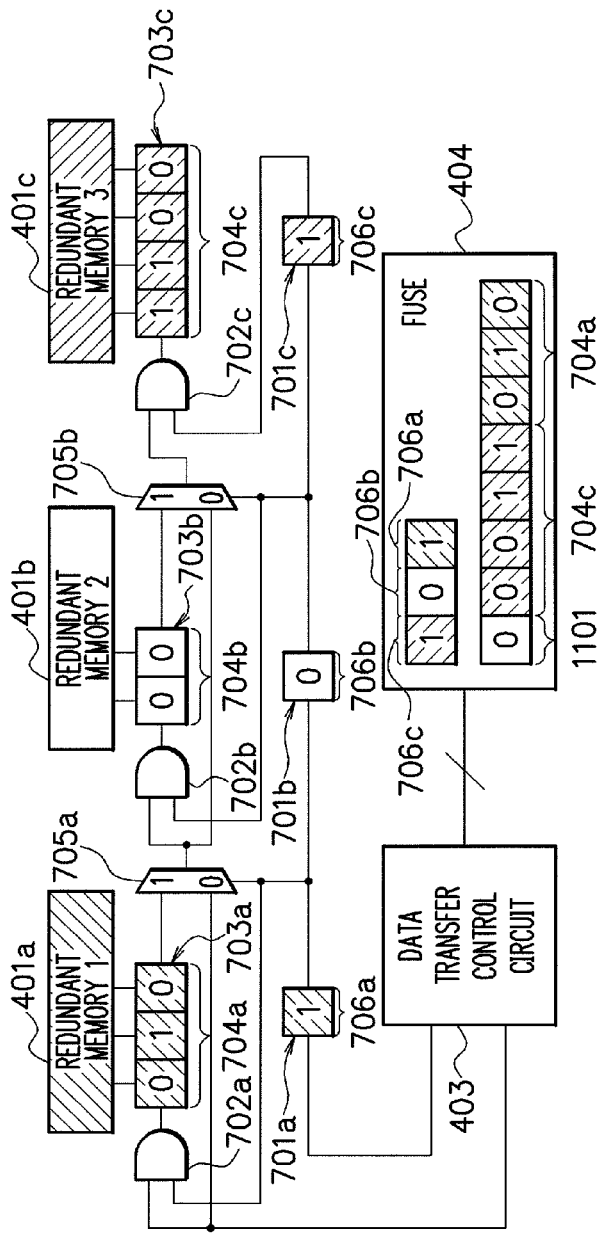

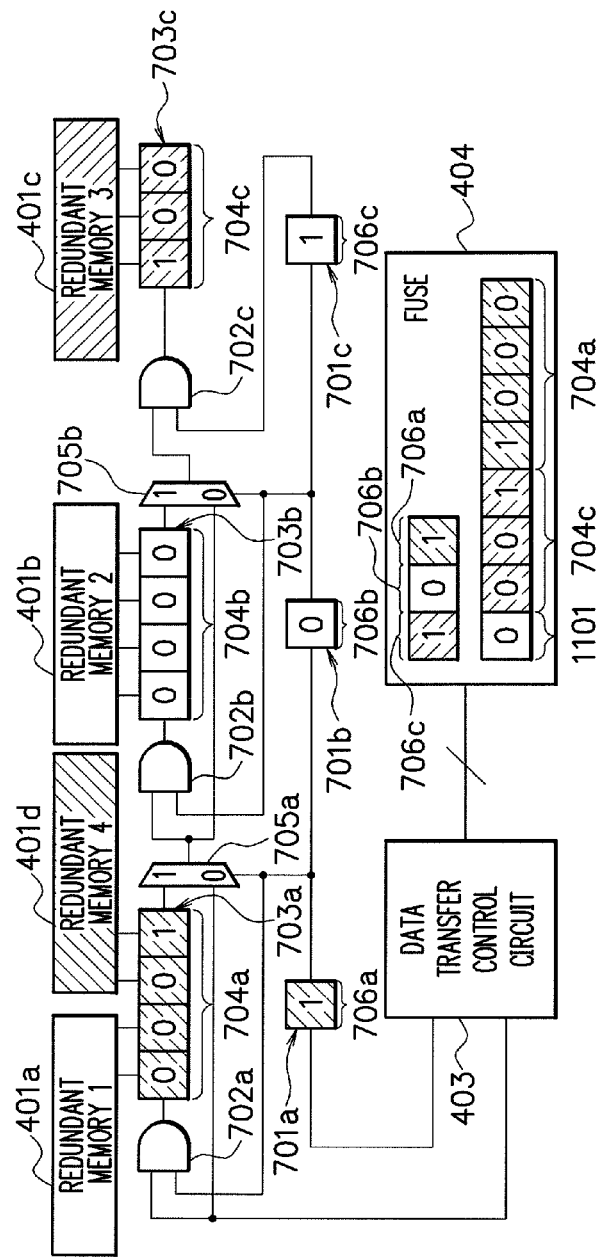
F I G. 12

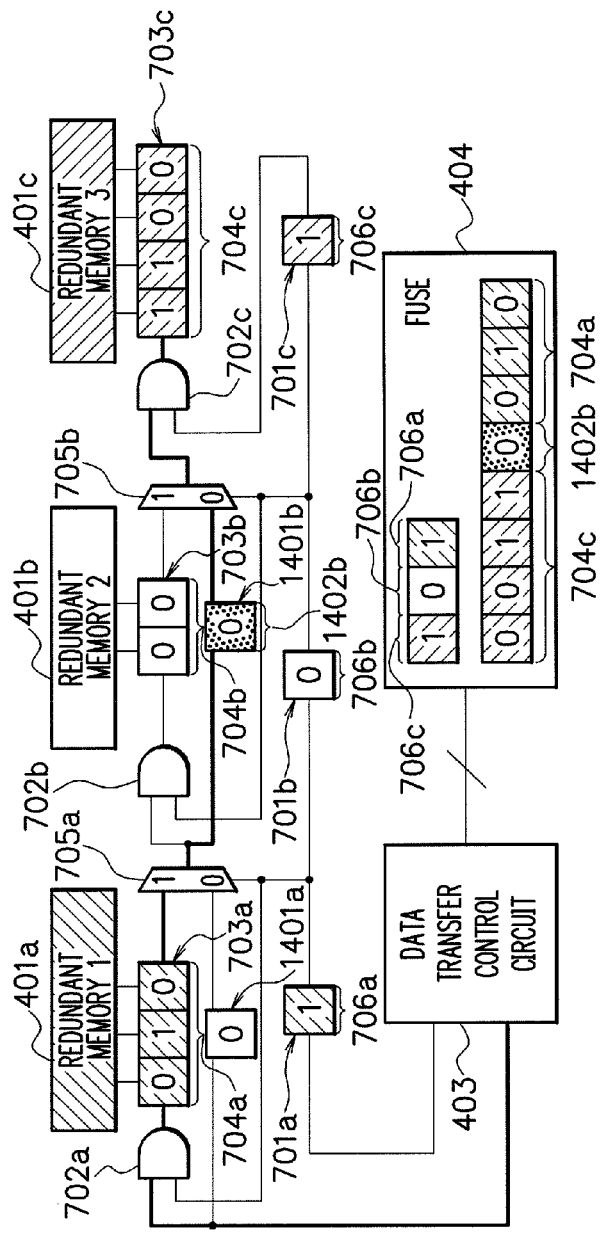
F I G. 14

MEMORY DEVICE INCLUDING REDUNDANT MEMORY CELL BLOCK

CROSS-REFERENCE TO RELATED APPLICATION

This application is based upon and claims the benefit of priority of the prior Japanese Patent Application No. 2011-270039, filed on Dec. 9, 2011, the entire contents of which are incorporated herein by reference.

FIELD

The embodiments relate to a memory device.

BACKGROUND

FIG. 1 depicts a configuration example of a memory device. Each of a first redundant memory 101a, a second redundant memory 101b, and a third redundant memory 101c includes a plurality of normal memory cell blocks and a redundant memory cell block. Even if one of the plurality of normal memory cell blocks includes a defective memory cell, the normal memory cell block including the defective memory cell can be switched to the redundant memory cell block to repair the defective memory cell, and the production yield can be improved. Each of a first flip-flop group 102a, a second flip-flop group 102b, and a third flip-flop group 102c, which are connected to each other in series, includes, for example, four flip-flops. A fuse circuit 105 is a non-volatile memory that stores repair data 103a of the first redundant memory 101a, repair data 103b of the second redundant memory 101b, and repair data 103c of the third redundant memory 101c. The repair data 103b indicates "0000" which denotes that the normal memory cell block is not to be switched to the redundant memory cell block. The repair data 103a and 103b is data other than "0000", indicating which one of the plurality of normal memory cell blocks is to be switched to the redundant memory cell block.

A data transfer control circuit 104 serially outputs the repair data 103c, 103b, and 103a stored in the fuse circuit 105 to serial connection circuits of the flip-flop groups 102a to 102c to serially transfer the repair data 103a to 103c to the flip-flop groups 102a to 102c. As a result, the repair data 103c is stored in the third flip-flop group 102c, the repair data 103b is stored in the second flip-flop group 102b, and the repair data 103a is stored in the first flip-flop group 102a. The first redundant memory 101a switches the normal memory cell block indicated by the repair data 103a stored in the first flip-flop group 102a among the plurality of normal memory cell blocks to the redundant memory cell block. Since the repair data 103b stored in the second flip-flop group 102b indicates "0000", the second redundant memory 101b does not switch the normal memory cell blocks to the redundant memory cell block. The third redundant memory 101c switches the normal memory cell block indicated by the repair data 103c stored in the third flip-flop group 102c among the plurality of normal memory cell blocks to the redundant memory cell block.

FIG. 2 depicts a configuration example of another memory device (for example, see Japanese Laid-open Patent Publication No. 2007-193879). Differences between the memory device of FIG. 2 and the memory device of FIG. 1 will be described. The first redundant memory 101a and the third redundant memory 101c include defective memory cells, and the second redundant memory 101b does not include a defective memory cell. The fuse circuit 105 stores: an ID (identifier) 201a and the repair data 103a of the first redundant memory 101a that includes the defective memory cell; and an ID 201c and the repair data 103c of the third redundant memory 101c that includes the defective memory cell. Since the ID 201c of the third redundant memory 101c is stored in the fuse circuit 105, the data transfer control circuit 104 serially transfers the repair data 103c of the third redundant memory 101c to the third flip-flop group 102c. Since an ID of the second redundant memory 101b is not stored in the fuse circuit 105, the data transfer control circuit 104 serially transfers the repair data 103b with a fixed value "0000" to the second flip-flop group 102c. Since the ID 201a of the first redundant memory 101a is stored in the fuse circuit 105, the data transfer control circuit 104 serially transfers the repair data 103a of the first redundant memory 101a to the first flip-flop group 102a. The repair data 103b of the second redundant memory 101b that does not include a defective memory cell does not have to be stored in the fuse circuit 105. Therefore, the storage capacity of the fuse circuit 105 can be reduced.

FIG. 3 depicts a configuration example of yet another memory device (for example, see Japanese Laid-open Patent Publication No. 2007-193879). Differences between the memory device of FIG. 3 and the memory device of FIG. 2 will be described. The data transfer control circuit 104 transfers, in parallel, the three pieces of repair data 103a to 103c to the three flip-flop groups 102a to 102c. This can reduce the transfer time of the repair data 103a to 103c. However, there is a problem that if the number of redundant memories 101a to 101c increases, the number of parallel connection wires between the data transfer control circuit 104 and the flip-flop groups 102a to 102c increases.

There is a known semiconductor integrated circuit including: a memory macro including a main memory cell array with a plurality of memory cells, a redundant memory array with a plurality of redundant cells, and a redundancy relief mechanism; a relief information analysis circuit including a non-volatile storage element that stores memory identification information for identifying the memory macro; and a relief information transfer circuit that transfers unit relief information, which at least includes the memory identification information and relief information, to the relief information analysis circuit (for example, see Japanese Laid-open Patent Publication No. 2009-43328).

There is a known integrated circuit system including: a plurality of memory devices that can relieve redundancy of a defective section by inputting device relief information which is information indicating a configuration for relieving the redundancy; and a plurality of relief information analysis circuits that receive relief information including identification information of the memory devices and device relief information of the memory devices to analyze the relief information, wherein one relief information analysis circuit corresponds to one memory device, and the relief information analysis circuits are serially connected through a serial transfer path (for example, see Japanese Laid-open Patent Publication No. 2008-226285).

There is a known semiconductor integrated circuit device including: a memory cell array including a plurality of memory cells arranged in an array; a redundant circuit that includes a plurality of auxiliary memory cells and that replaces a defective memory cell in the memory cell array with a specific auxiliary memory cell based on programmed address information; a storage circuit that is for programming the address information and that includes a plurality of non-volatile storage elements; and a transfer circuit that transfers the address information programmed in the storage circuit to the redundant circuit (for example, see Japanese Laid-open Patent Publication No. 2004-133970).

[Patent Literature 1] Japanese Laid-open Patent Publication No. 2007-193879
[Patent Literature 2] Japanese Laid-open Patent Publication No. 2009-43328
[Patent Literature 3] Japanese Laid-open Patent Publication No. 2008-226285
[Patent Literature 4] Japanese Laid-open Patent Publication No. 2004-133970

SUMMARY

A memory device includes: a first redundant memory that includes a plurality of normal memory cell blocks and a redundant memory cell block; a second redundant memory that includes a plurality of normal memory cell blocks and a redundant memory cell block; a non-volatile memory that stores a first repair flag, a second repair flag, and repair data; a first repair flag flip-flop that stores the first repair flag stored in the non-volatile memory; a first repair data flip-flop group that stores repair data; a second repair flag flip-flop that is connected in series to the first repair flag flip-flop and that stores the second repair flag stored in the non-volatile memory; a second repair data flip-flop group that can be connected to the first repair flag flip-flop and that stores repair data; and a data transfer control circuit that supplies a clock signal to the first repair flag flip-flop, the second repair flag flip-flop, the first repair data flip-flop group, and the second repair data flip-flop group to serially transfer the second repair flag and the first repair flag stored in the non-volatile memory to the second repair flag flip-flop and the first repair flag flip-flop, and subsequently, serially outputs the repair data stored in the non-volatile memory to the first repair data flip-flop group and serially transfers the repair data of the first repair data flip-flop group and the second repair data flip-flop group, wherein the first redundant memory switches one of the plurality of normal memory cell blocks to the redundant memory cell block according to the repair data stored in the first repair data flip-flop group, and the second redundant memory switches one of the plurality of normal memory cell blocks to the redundant memory cell block according to the repair data stored in the second repair data flip-flop group.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 depicts a configuration example of large-scale integration (LSI) according to a first embodiment;
FIG. 8 is a timing chart depicting a process example of the memory device of FIG. 7;
FIG. 10 depicts serial transfer of repair data to repair data flip-flop groups;
FIG. 11 depicts a configuration example of a memory device according to a second embodiment;
FIG. 12 depicts a configuration example of a memory device according to a third embodiment;
FIG. 14 depicts a configuration example of a memory device according to a fifth embodiment.

DESCRIPTION OF EMBODIMENTS

First Embodiment

Figure 1:
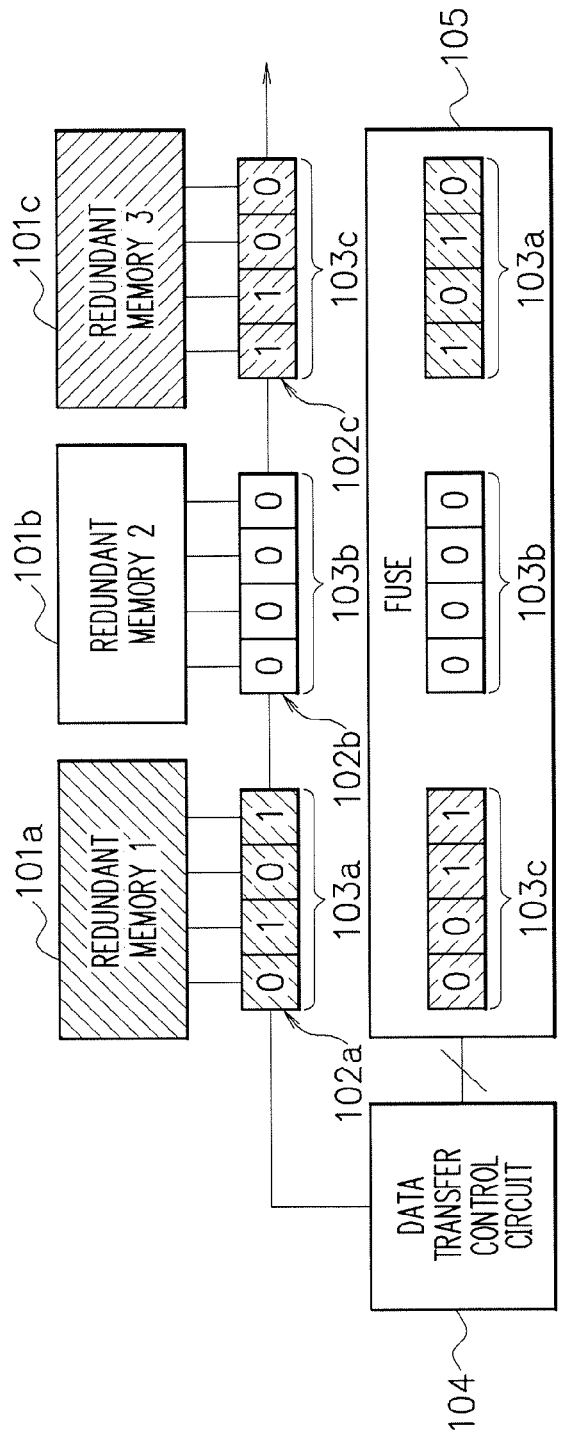
FIG. 1 depicts a configuration example of a memory device.

FIG. 4 depicts a configuration example of large-scale integration (LSI) 400 according to a first embodiment. The large-scale integration 400 is a semiconductor circuit and includes a memory device and a logic circuit 405. The memory device includes redundant memories 401a to 401c, repair data acquisition circuits 402a to 402c, a data transfer control circuit 403, and a non-volatile memory (fuse circuit) 404. A logic circuit 405 can write and read data to and from the redundant memories 401a to 401c. Although the redundant memories 401a to 401c are, for example, SRAMs (Static Random Access Memories) in the description, the redundant memories 401a to 401c may be other types of memories such as DRAMs (Dynamic Random Access Memories).

Figure 5:
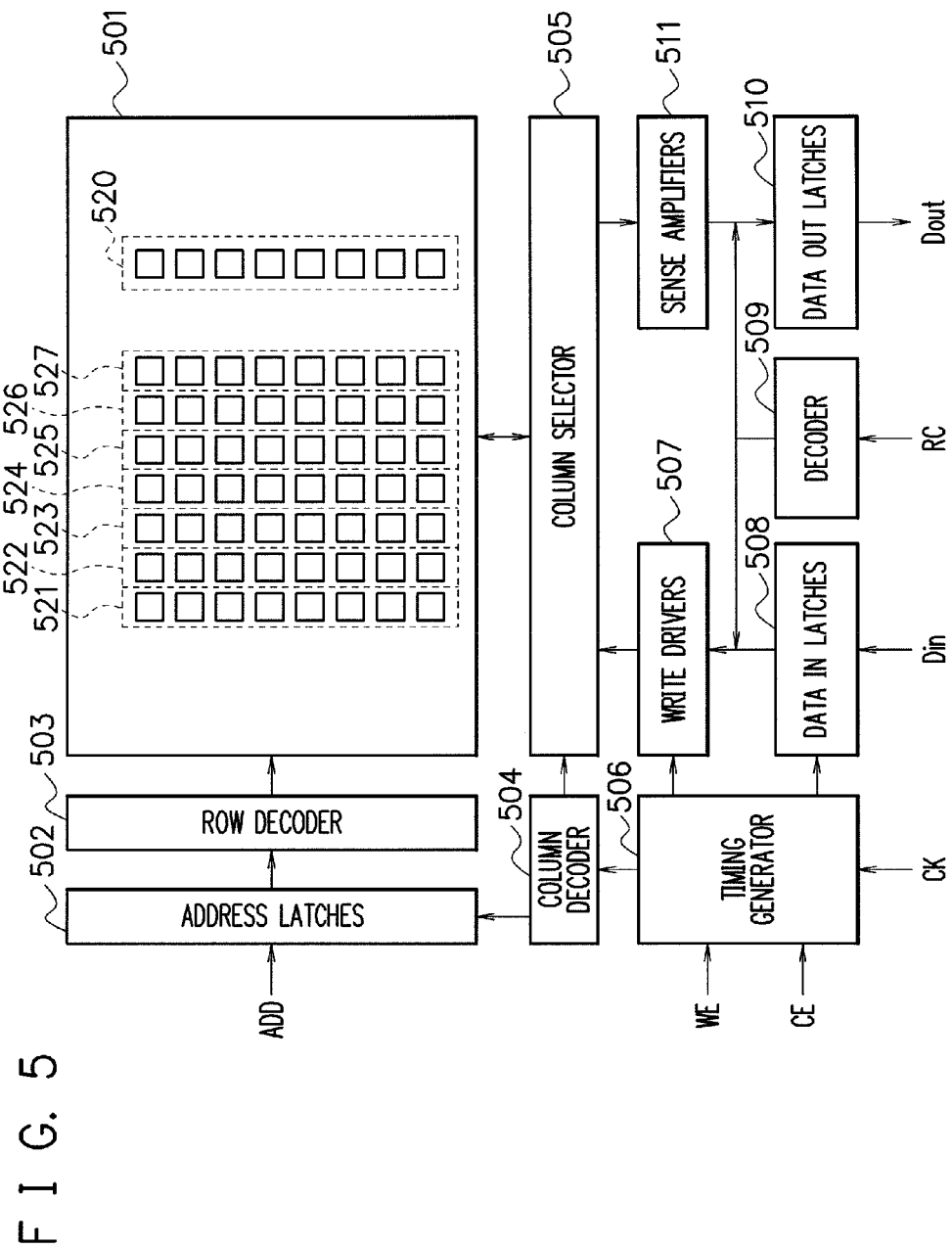
FIG. 5 depicts a configuration example of redundant memories of FIG. 4.

FIG. 5 depicts a configuration example of the redundant memories 401a to 401c of FIG. 4. A memory cell matrix 501 includes a plurality of normal memory cell blocks 521 to 527 and a redundant memory cell block 520. Although each of the normal memory cell blocks 521 to 527 and the redundant memory cell block 520 includes a plurality of memory cells in the example, each of the normal memory cell blocks 521 to 527 and the redundant memory cell block 520 may include one memory cell. The memory cells are arranged in a two-dimensional matrix, and the memory cells store data. In the memory cells, each row is connected to a word line, and each column is connected to a bit line.

A timing generator 506 receives a clock signal CK, a write enable signal WE, and a clock enable signal CE from the logic circuit 405 of FIG. 4 and outputs a control signal to a column decoder 504, write drivers 507, and data input latches 508. The column decoder 504 decodes the control signal, outputs a latch signal to address latches 502, and outputs a column selection signal to a column selector 505. The address latches 502 latch an address ADD input from the logic circuit 405 in synchronization with the latch signal and output the address ADD to a row decoder 503. The row decoder 503 decodes the address ADD and outputs a selection signal to the word line of the memory cell matrix 501. The row of the memory cell provided with the selection signal is selected.

A write operation will be described. The data input latches 508 latch input data (write data) Din input from the logic circuit 405 in synchronization with the latch signal and output the input data Din to the write drivers 507. A decoder 509 decodes repair data RC input from the repair data acquisition circuits 402a to 402c of FIG. 4 and outputs a repair selection signal to the write drivers 507 and sense amplifiers 511. The write drivers 507 output the input data Din to the bit line of the column selector 505 selected by the repair selection signal. The column selector 505 outputs the input data Din to the bit line of the memory cell matrix 501 selected by the column selection signal. The input data Din of the bit line is written in the memory cell selected by the word line.

A read operation will be described. The memory cell selected by the word line outputs the stored data to the bit line. The sense amplifiers 511 amplify the data of the bit line of the column selector 505 selected by the repair selection signal and output the data to the data output latches 510. The data output latches 510 latch the data and output output data (read data) Dout to the logic circuit 405.

Figure 6A:
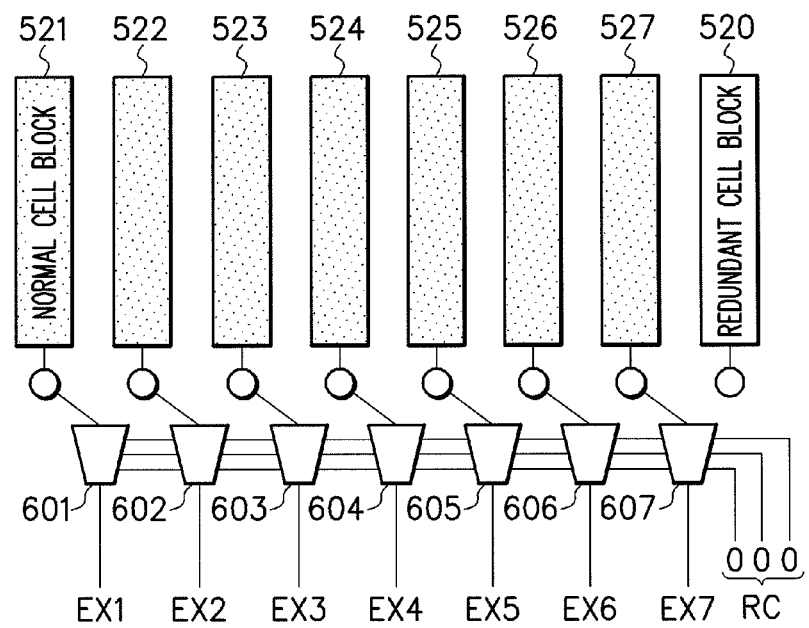
FIGS. 6A and 6B depict configuration examples of part of the redundant memory.

FIG. 6A depicts a configuration example of part of the redundant memory 401a. The redundant memories 401b and 401c also have similar configurations as the redundant memory 401a. The redundant memory 401a includes the normal memory cell blocks 521 to 527, the redundant memory cell block 520, and selectors 601 to 607. The selectors 601 to 607 are arranged in, for example, the write drivers 507 and the sense amplifiers 511 of FIG. 5. If none of the normal memory cell blocks 521 to 527 includes a defective memory cell, repair data RC with a fixed value "000" is input to the redundant memory 401a. Based on the repair data RC of "000", the selectors 601 to 607 connect the bit lines of the seven normal memory cell blocks 521 to 527 to seven external lines EX1 to EX7. The external lines EX1 to EX7 are, for example, lines of the data input latches 508 or the data output latches 510. The redundant memory cell block 520 is not connected to the external lines EX1 to EX7.

Figure 6B:
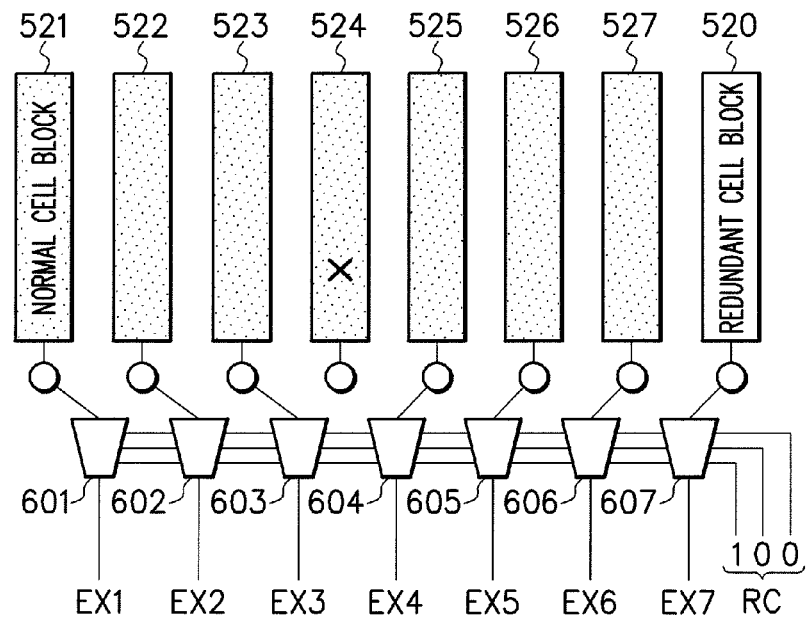

FIG. 6B corresponds to FIG. 6A and depicts a case in which the normal memory cell block 524 includes a defective memory cell. The repair data RC indicates binary data "100" ("4" in decimal notation) which denotes that the fourth normal memory cell block 524 includes a defective memory cell. Based on the repair data RC of "100", the selectors 601 to 607 connect the bit lines of the normal memory cell blocks 521 to 523, 525 to 527, and the redundant memory cell block 520 to the external lines EX1 to EX7, respectively. The bit line of the fourth normal memory cell block 524 including the defective memory cell is not connected to the external lines EX1 to EX7. The redundant memory 401a switches the normal memory cell block 524 indicated by the repair data RC to the redundant memory cell block 520. In this way, even if the fourth normal memory cell block 524 includes the defective memory cell, the fourth normal memory cell block 524 can be switched to the redundant memory cell block 520 to repair the defective memory cell, and the reproduction yield can be improved. A normal memory cell block to be switched among the normal memory cell blocks 521 to 527 can be designated by the repair data RC.

Although each of the normal memory cell blocks 521 to 527 and the redundant memory cell block 520 is a column memory cell block including a column of memory cells in the example described above, each of the normal memory cell blocks 521 to 527 and the redundant memory cell block 520 may be a row memory cell block including a row of memory cells. In that case, the selectors 601 to 607 switch the word lines of the normal memory cell blocks 521 to 527 and the redundant memory cell block 520.

Figure 7:
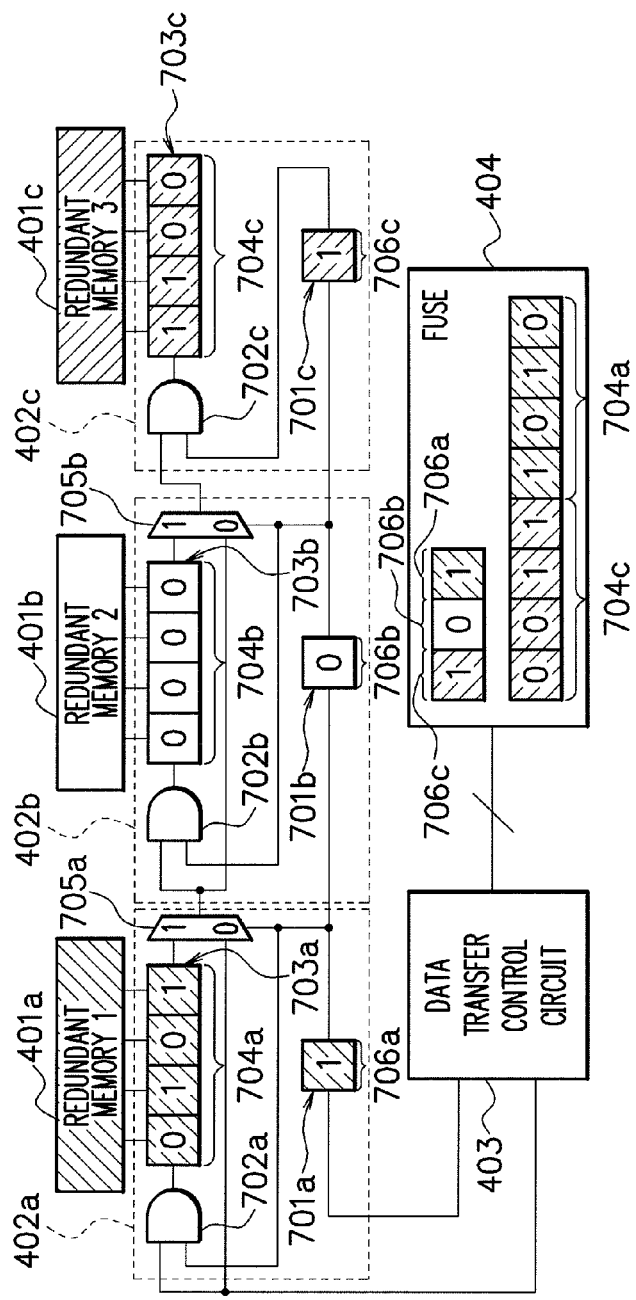
FIG. 7 depicts a configuration example of a memory device including the redundant memories, repair data acquisition circuits, a non-volatile memory, and a data transfer control circuit of FIG. 4.

FIG. 7 depicts a configuration example of a memory device including the redundant memories 401a to 401c, the repair data acquisition circuits 402a to 402c, the non-volatile memory 404, and the data transfer control circuit 403 of FIG. 4. In the example described here, the redundant memories 401a and 401c include defective memory cells, and the redundant memory 401b does not include a defective memory cell. The redundant memories 401a and 401c switch the cells to the redundant memory cell blocks 520, and the redundant memory 401b does not switch the cells to the redundant memory cell 520.

The first repair data acquisition circuit 402a includes a first repair flag flip-flop 701a, a first logic circuit 702a, a first repair data flip-flop group 703a, and a first selector 705a. The second repair data acquisition circuit 402b includes a second repair flag flip-flop 701b, a second logic circuit 702b, a second repair data flip-flop group 703b, and a second selector 705b. The third repair data acquisition circuit 402c includes a third repair flag flip-flop 701c, a third logic circuit 702c, and a third repair data flip-flop group 703c. The repair data flip-flop groups 703a to 703c include, for example, four flip-flops each and can store repair data 704a to 704c of four bits.

As described, each of the redundant memories 401a to 401c includes a plurality of normal memory cell blocks and the redundant memory cell block 520. The normal memory cell blocks correspond to the normal memory cell blocks 521 to 527 of FIGS. 5, 6A, and 6B. However, the number of bits of the repair data changes according to the number of normal memory cell blocks. The non-volatile memory 404 is, for example, a fuse circuit which holds the memory content even if the power is turned off. The non-volatile memory 404 stores repair flags 706a to 706c and the repair data 704a and 704c. The non-volatile memory 404 may be a non-volatile memory other than the fuse circuit.

The first repair flag 706a indicates whether to switch one of the plurality of normal memory cell blocks in the first redundant memory 401a to the redundant memory cell block 520. The second repair flag 706b indicates whether to switch one of the plurality of normal memory cell blocks in the second redundant memory 401b to the redundant memory cell block 520. The third repair flag 706c indicates whether to switch one of the plurality of normal memory cell blocks in the third redundant memory 401c to the redundant memory cell block 520. The repair flags 706a to 706c indicate "1" when the normal memory cell blocks are to be switched and indicate "0" when the normal memory cell blocks are not to be switched. For example, the first repair flag 706a and the third repair flag 706c indicate "1", and the second repair flag 706b indicates "0". Therefore, the first redundant memory 401a and the third redundant memory 401c switch the normal memory block cells to the redundant memory cell blocks 520, and the second redundant memory 401b does not switch the normal memory block cells to the redundant memory cell block 520.

The repair data 704a and 704c indicate which one of the plurality of normal memory cell blocks is to be switched to the redundant memory cell 520, in the redundant memories 401a and 401c in which one of the plurality of normal memory cell blocks is to be switched to the redundant memory cell block 520. The first repair data 704a is, for example, "0101" indicating which one of the plurality of normal memory cell blocks in the first redundant memory 401a is to be switched to the redundant memory cell 520. The third repair data 704c is, for example, "1100" indicating which one of the plurality of normal memory cell blocks in the third redundant memory 401c is to be switched to the redundant memory cell 520.

The first repair flag flip-flop 701a is a flip-flop for storing the first repair flag 706a stored in the non-volatile memory 404. The data transfer control circuit 403 serially outputs, from lower bits, the repair data 704c and 704a stored in the non-volatile memory 404 to the first logic circuit 702a. The first logic circuit 702a is an AND circuit and outputs the repair data 704c, 704a, or the repair data "0" as a fixed value stored in the non-volatile memory 404 according to the first repair flag 706a stored in the first repair flag flip-flop 701a. Specifically, the first logic circuit 702a outputs AND data of the first repair flag 706a stored in the first repair flag flip-flop 701 and the repair data 704c and 704a stored in the non-volatile memory 404. For example, since the first repair flag 706a indicates "1", the first logic circuit 702a serially outputs, from lower bits, a bit string "00111010" of the repair data 704c and 704a. The first repair data flip-flop group 703a stores the repair data output by the first logic circuit 702a. The first selector 705a outputs the repair data stored in the non-volatile memory 404 or the repair data stored in the first repair data flip-flop group 703a according to the first repair flag 706a stored in the first repair flag flip-flop 701a. The first selector 705a outputs the repair data stored in the first repair data flip-flop group 703a when the first repair flag 706a indicates "1" and outputs the repair data 704c and 704a stored in the non-volatile memory 404 when the first repair flag 706a indicates "0".

The second repair flag flip-flop 701b is a flip-flop that is connected in series to the first repair flag flip-flop 701a and that is for storing the second repair flag 706b stored in the non-volatile memory 404. The second logic circuit 702b is an AND circuit and outputs the repair data output by the first selector 705a or the repair data "0" as a fixed value according to the second repair flag 706b stored in the second repair flag flip-flop 701b. Specifically, the second logic circuit 702b outputs AND data of the second repair flag 706b stored in the second repair flag flip-flop 701b and the repair data output by the first selector 705a. For example, since the second repair flag 706b indicates "0", the second logic circuit 702b consecutively outputs the repair data "0" as a fixed value. The second repair data flip-flop group 703b stores the repair data output by the second logic circuit 702b. The second selector 705b outputs the repair data output by the first selector 705a or the repair data stored in the second repair data flip-flop group 703b according to the second repair flag 706b stored in the second repair flag flip-flop 701b. The second selector 705b outputs the repair data stored in the second repair data flip-flop group 703b when the second repair flag 706b indicates "1" and outputs the repair data output by the first selector 705a when the second repair flag 706b indicates "0".

The third repair flag flip-flop 701c is a flip-flop that is connected in series to the second repair flag flip-flop 701b and that is for storing the third repair flag 706c stored in the non-volatile memory 404. The third logic circuit 702c is an AND circuit and outputs the repair data output by the second selector 705b or the repair data "0" as a fixed value according to the third repair flag 706c stored in the third repair flag flip-flop 701c. Specifically, the third logic circuit 702c outputs AND data of the third repair flag 706c stored in the third repair flag flip-flop 701c and the repair data output by the second selector 705b. For example, since the third repair flag 706c indicates "1", the third logic circuit 702c outputs the repair data output by the second selector 705b. The third repair data flip-flop group 703c stores the repair data output by the third logic circuit 702c.

As with the redundant memories 401a to 401c and the repair data acquisition circuits 402a to 402c, four or more sets of the redundant memories and the repair data acquisition circuits may be connected.

Figure 9:
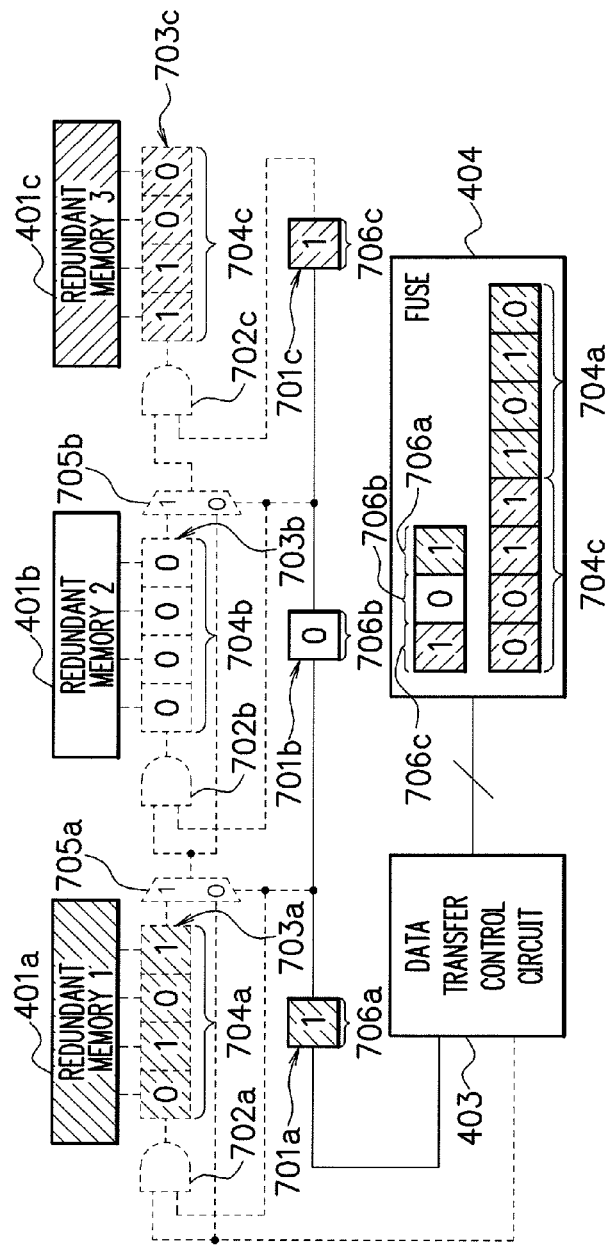
FIG. 9 depicts serial transfer of repair flags to repair flag flip-flops.

FIG. 8 is a timing chart depicting a process example of the memory device of FIG. 7. FIG. 9 depicts serial transfer of the repair flags 706a to 706c to the repair flag flip-flops 701a to 701c. FIG. 10 depicts serial transfer of the repair data 704a to 704c to the repair data flip-flop groups 703a to 703c.

A process of serially transferring the repair flags 706a to 706c to the repair flag flip-flops 701a to 701c will be described with reference to FIGS. 8 and 9. The data transfer control circuit 403 outputs a clock signal CK1 with three pulses corresponding to the repair flags 706a to 706c with three bits to the repair flag flip-flops 701a to 701c. The data transfer control circuit 403 also serially outputs the repair flags 706c, 706b, and 706a with three bits in the non-volatile memory 404 to the flip-flop 701a.

The flip-flop 701a latches and stores "1" of the third repair flag 706c in synchronization with the rising edge of a first pulse of the clock signal CK1.

The flip-flop 701b latches and stores "1" of the third repair flag 706c in synchronization with the rising edge of a second pulse of the clock signal CK1. The flip-flop 701a latches and stores "0" of the second repair flag 706b in synchronization with the rising edge of the second pulse of the clock signal CK1.

The flip-flop 701c latches and stores "1" of the third repair flag 706c in synchronization with the rising edge of a third pulse of the clock signal CK1. The flip-flop 701b latches and stores "0" of the second repair flag 706b in synchronization with the rising edge of the third pulse of the clock signal CK1. The flip-flop 701a latches and stores "1" of the first repair flag 706a in synchronization with the rising edge of the third pulse of the clock signal CK1.

Subsequently, the flip-flop 701a maintains the storage state of "1" in the first repair flag 706a. The flip-flop 701b maintains the storage state of "0" in the second repair flag 706b. The flip-flop 701c maintains the storage state of "1" in the third repair flag 706c.

A process of serially transferring the repair data 704a to 704c to the repair data flip-flop groups 703a to 703c will be described with reference to FIGS. 8 and 10. Subsequently, the data transfer control circuit 403 outputs the clock signal CK1 with eight pulses corresponding to the repair data 704c and 704a with eight bits to the repair data flip-flop groups 703a to 703c. Meanwhile, the clock signal of the repair flag flip-flops 701a to 701c is stopped. The data transfer control circuit 403 forms a data string "00111010" from lower bits of the repair data 704c and 704a with eight bits in the non-volatile memory 404 and serially outputs the data string to the first logic circuit 702a.

The flip-flop group 703a latches and stores the lower first bit "0" of the third repair data 704c in synchronization with the rising edge of a fourth pulse of the clock signal CK1. The flip-flop group 703b latches and stores the repair data "0" as a fixed value in synchronization with the rising edge of the fourth pulse of the clock signal CK1.

The flip-flop group 703a latches and stores the lower first and second bits "00" of the third repair data 704c in synchronization with the rising edge of a fifth pulse of the clock signal CK1. The flip-flop group 703b latches and stores repair data "00" as a fixed value in synchronization with the rising edge of the fifth pulse of the clock signal CK1.

The flip-flop group 703a latches and stores the lower first to third bits "100" of the third repair data 704c in synchronization with the rising edge of a sixth pulse of the clock signal CK1. The flip-flop group 703b latches and stores repair data "000" as a fixed value in synchronization with the rising edge of the sixth pulse of the clock signal CK1.

The flip-flop group 703a latches and stores the lower first to fourth bits "1100" of the third repair data 704c in synchronization with the rising edge of a seventh pulse of the clock signal CK1. The flip-flop group 703b latches and stores repair data "0000" as a fixed value in synchronization with the rising edge of the seventh pulse of the clock signal CK1.

The flip-flop group 703a latches and stores "1110", which is the lower first bit of the first repair data 704a and the lower second to fourth bits of the third repair data 704c, in synchronization with the rising edge of an eighth pulse of the clock signal CK1. The flip-flop group 703b latches and stores the repair data "0000" as a fixed value in synchronization with the rising edge of the eighth pulse of the clock signal CK1. The flip-flop group 703c latches and stores the lower first bit "0" of the third repair data 704c in synchronization with the rising edge of the eighth pulse of the clock signal CK1.

The flip-flop group 703a latches and stores "0111", which is the lower first and second bits of the first repair data 704a and the lower third and fourth bits of the third repair data 704c, in synchronization with the rising edge of a ninth pulse of the clock signal CK1. The flip-flop group 703b latches and stores the repair data "0000" as a fixed value in synchronization with the rising edge of the ninth pulse of the clock signal CK1. The flip-flop group 703c latches and stores the lower first and second bits "00" of the third repair data 704c in synchronization with the rising edge of the ninth pulse of the clock signal CK1.

The flip-flop group 703a latches and stores "1011", which is the lower first to third bits of the first repair data 704a and the lower fourth bit of the third repair data 704c in synchronization with the rising edge of a tenth pulse of the clock signal CK1. The flip-flop group 703b latches and stores the repair data "0000" as a fixed value in synchronization with the rising edge of the tenth pulse of the clock signal CK1. The flip-flop group 703c latches and stores the lower first to third bits "100" of the third repair data 704c in synchronization with the rising edge of the tenth pulse of the clock signal CK1.

The flip-flop group 703a latches and stores the lower first to fourth bits "0101" of the first repair data 704a in synchronization with the rising edge of an eleventh pulse of the clock signal CK1. The flip-flop group 703b latches and stores the repair data "0000" as a fixed value in synchronization with the rising edge of the eleventh pulse of the clock signal CK1. The flip-flop group 703c latches and stores the lower first to fourth bits "1100" of the third repair data 704c in synchronization with the rising edge of the eleventh pulse of the clock signal CK1.

Subsequently, the flip-flop group 703a maintains the storage state of "0101" in the first repair data 704a. The flip-flop group 703b maintains the storage state of the fixed state "0000" in the second repair data 704b. The flip-flop group 703c maintains the storage state of "1100" in the third repair data 704c.

In this way, the data transfer control circuit 403 supplies the clock signal CK1 to the repair flag flip-flops 701a to 701c as depicted in FIG. 9 to serially transfer the repair flags 706a to 706c stored in the non-volatile memory to the repair flag flip-flops 701a to 701c.

Subsequently, the data transfer control circuit 403 supplies the clock signal CK1 to the repair data flip-flop groups 703a to 703c as depicted in FIG. 10 to serially output the repair data 704c and 704a stored in the non-volatile memory 404 to the first logic circuit 702a and to serially transfer the repair data of the repair data flip-flop groups 703a to 703c.

The first redundant memory 401a switches one of the plurality of normal memory cell blocks to the redundant memory cell block 520 according to the repair data 704a stored in the first repair data flip-flop group 703a. The first redundant memory 401a does not switch the normal memory cell blocks to the redundant memory cell block 520 when the repair data 704a stored in the first repair data flip-flop group 703a is the repair data "0000" as a fixed value.

The second redundant memory 401b does not switch the normal memory cell blocks to the redundant memory cell block 520 when the repair data 704b stored in the second repair data flip-flop group 703b is the repair data "0000" as a fixed value. If the repair data 704b indicates a value other than "0000", the second redundant memory 401b switches one of the plurality of normal memory cell blocks to the redundant memory cell block 520 according to the repair data 704b stored in the second repair data flip-flop group 703b.

The third redundant memory 401c switches one of the plurality of normal memory cell blocks to the redundant memory cell block 520 according to the repair data 704c stored in the third repair data flip-flop group 703c. The third redundant memory 401c does not switch the normal memory cell blocks to the redundant memory cell block 520 when the repair data 704c stored in the third repair data flip-flop group 703c is the repair data "0000" as a fixed value.

According to the present embodiment, the repair data 704b of the second redundant memory 401b, in which the normal memory cell blocks are not switched to the redundant memory cell block 520, does not have to be stored in the non-volatile memory 404. Therefore, the storage capacity of the non-volatile memory 404 can be reduced. In recent years, a memory device includes a large number of normal memory cell blocks along with the increase in the storage of the memory device. The probability of occurrence of defective memory cells in a large number of normal memory cell blocks is significantly low. More specifically, the number of redundant memories with defective memory cells among the large number of redundant memories 401a to 401c is significantly small. Therefore, the number of repair data with the repair data "0000" as a fixed value among the large number of repair data 704a to 704c is significantly large. As a result, the storage capacity of the non-volatile memory 404 can be considerably reduced.

An effect of the present embodiment will be described. For example, it is assumed that the number of the redundant memories 401a to 401c and the like is 100, the number of bits of each of the repair data 704a to 704c and the like is 10 bits, and the total number of bits of the repair data stored in the non-volatile memory 404 is 200 bits (bits for twenty redundant memories).

In the memory device of FIG. 1 and the memory device of FIG. 2, the time for transferring 100 pieces of repair data 103a to 103c and the like to 100 flip-flop groups 102a to 102c and the like is as in the following formula.

Data Transfer Time=100×10 bits=1000 cycles

Meanwhile, in the memory device of FIG. 7, the data transfer time is expressed by a sum of the transfer time of 100 repair flags and the transfer time of the repair data of 200 bits as in the following formula.

$$\begin{aligned}\text{Data Transfer Time} &= \text{Transfer Time of Repair Flags} + \\ &\quad \text{Transfer Time of Repair Data} \\ &= 100 \text{ bits} + 200 \text{ bits} \\ &= 300 \text{ cycles}\end{aligned}$$

Figure 2:
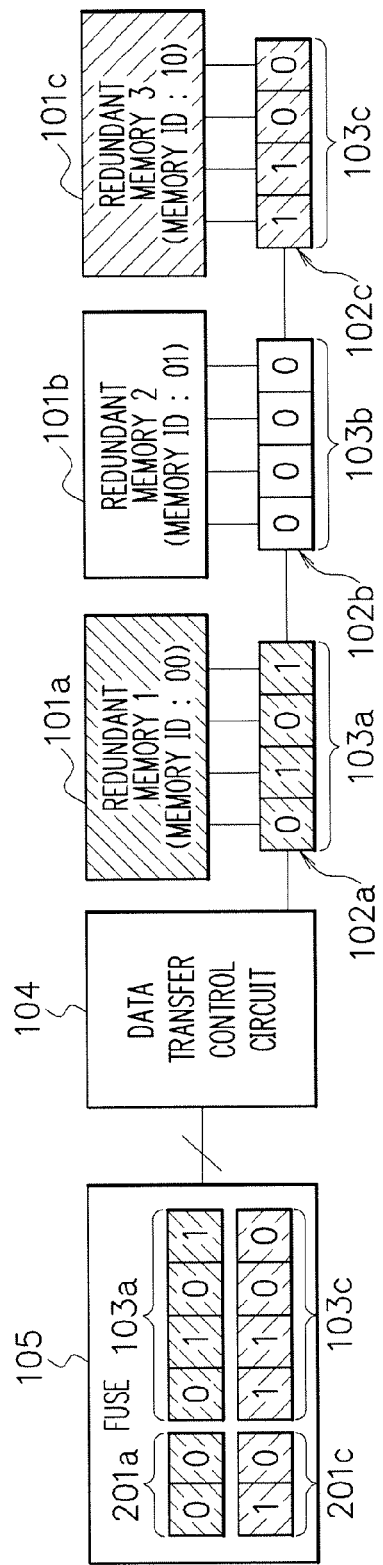
FIG. 2 depicts a configuration example of another memory device.

In this way, the memory device of FIG. 7 can reduce the data transfer time compared to the memory device of FIG. 1 and the memory device of FIG. 2.

Although the repair data as a fixed value for not switching to the redundant memory cell block 520 is "0000" in the example, the repair data may be another value. In that case, the logic circuits 702a to 702c can be circuits capable of setting the fixed value.

Second Embodiment

FIG. 11 depicts a configuration example of a memory device according to a second embodiment. Differences between the present embodiment and the first embodiment will be described. In the first embodiment, the repair data 704a to 704c of the redundant memories 401a to 401c all have the same data length of four bits. In the present embodiment, the repair data 704a to 704c of the redundant memories 401a to 401c have different data lengths. More specifically, the numbers of flip-flops in the repair data flip-flop groups 703a to 703c are different from each other. For example, the length of the first repair data 704a is three bits, and the first repair data flip-flop group 703a includes three flip-flops. The length of the second repair data 704b is two bits, and the second repair data flip-flop group 703b includes two flip-flops. The length of the third repair data 704c is four bits, and the third repair data flip-flop group 703c includes four flip-flops. The numbers of the flip-flops in the repair data flip-flop groups 703a to 703c are the same as the number of bits in the repair data 704a to 704c.

The non-volatile memory 404 includes, for example, a repair data storage area with a fixed length with eight bits as in FIG. 7. In the repair data storage area, the repair data 704a and 704c for switching to the redundant memory cell block 520 are slid backward (slid to the right in FIG. 11) and stored, and first dummy repair data 1101 is stored in an open area in the front (left side in FIG. 11). The first dummy repair data 1101 may indicate "0" or may indicate "1".

The same process as in the first embodiment (FIG. 8) is executed in the present embodiment. More specifically, the repair flags 706a to 706c are serially transferred based on three pulses of the clock signal CK1. As in the first embodiment, the repair flags 706a to 706c are serially transferred to the flip-flops 701a to 701c. The repair data 704a to 704c are serially transferred based on the clock signal CK1 with eight pulses which are the same as the fixed bit length of the repair data storage area with eight bits in the non-volatile memory 404. The first dummy repair data 1101 is pushed out from the third repair data flip-flop group 703c as a result of the serial transfer. The third repair data 704c is set to the third repair data flip-flop group 703c. The second repair data 704b is set to the second repair data flip-flop group 703b. The first repair data 704a is set to the first repair data flip-flop group 703a.

The non-volatile memory 404 stores the first dummy repair data 1101 and the repair data 704c of the third redundant memory 401c as well as the repair data 704a of the first redundant memory 401a for switching to the redundant memory cell block 520. The data transfer control circuit 403 serially outputs the first dummy repair data 1101 to the first logic circuit 702a and then serially outputs the repair data 704c of the third redundant memory 401c and the repair data 704a of the first redundant memory 401a to the first logic circuit 702a.

In this way, according to the present embodiment, even if the bit lengths of the repair data 704a to 704c are different from each other, the first dummy repair data 1101 can be stored in the open area in the front of the repair data storage area of the non-volatile memory 404 to serially transfer the repair data 704a to 704c to the repair data flip-flop groups 703a to 703c.

Third Embodiment

FIG. 12 depicts a configuration example of a memory device according to a third embodiment. Differences between the present embodiment and the second embodiment will be described. As with the redundant memories 401a to 401c, a fourth redundant memory 401d includes a plurality of normal memory cell blocks and the redundant memory cell block 520. The first redundant memory 401a switches one of the plurality of normal memory cell blocks to the redundant memory cell block 520 according to data of a part (upper two bits) of the repair data 704a stored in the first repair data flip-flop group 703a. The fourth redundant memory 401d switches one of the plurality of normal memory cell blocks to the redundant memory cell block 520 according to data of another part (lower two bits) of the repair data 704a stored in the first repair data flip-flop group 703a. The upper two bits of the repair data 704a are the repair data of the first redundant memory 401a, and the lower two bits are the repair data of the fourth redundant memory 401d. The repair flag 706a is a common repair flag of the first redundant memory 401a and the fourth redundant memory 401d. The process by the data transfer control circuit 403 is the same as in the second embodiment.

According to the present embodiment, a repair flag corresponding to the fourth redundant memory 401d does not have to be stored in the non-volatile memory 404 in addition to the repair flag 706a of the first redundant memory 401a. Therefore, the storage capacity of the non-volatile memory 404 can be reduced. The fourth redundant memory 401d shares the repair flag flip-flop 701a, the logic circuit 702a, and the selector 705a with the first redundant memory 401a. Therefore, a repair flag flip-flop, a logic circuit, and a selector for exclusive use by the fourth redundant memory 401d do not have to be arranged, and the circuit area of the memory device can be reduced.

Fourth Embodiment

Figure 13:
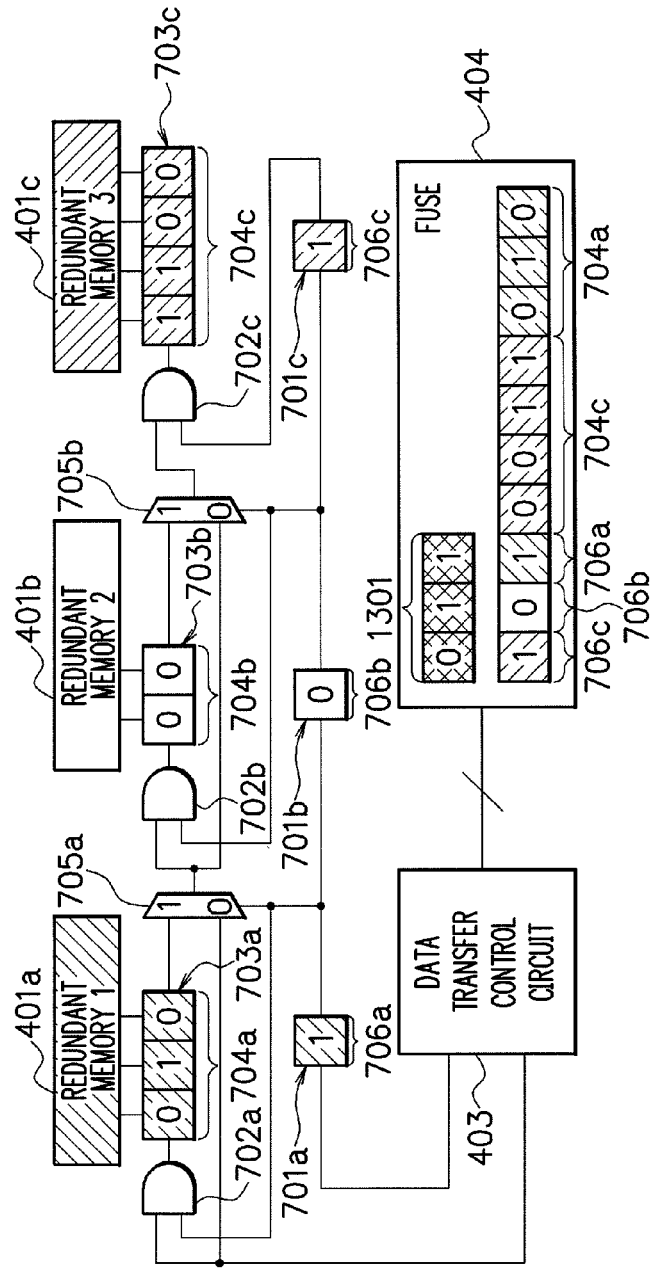
FIG. 13 depicts a configuration example of a memory device according to a fourth embodiment.

FIG. 13 depicts a configuration example of a memory device according to a fourth embodiment. Differences from the first and second embodiments in the present embodiment will be described. The number of repair flags 706a to 706c can be variable in the present embodiment. The non-volatile memory 404 stores the number 1301 of the repair flags 706a to 706c in addition to the repair flags 706a to 706c and the repair data 704a and 704c. For example, when three repair flags 706a to 706c are stored in the non-volatile memories 404, the number 1301 of repair flags is "011" in binary notation ("3" in decimal notation). The data transfer control circuit 403 reads out the repair flags 706a to 706c from the non-volatile memory 404 according to the number 1301 of repair flags stored in the non-volatile memory 404 and serially transfers the repair flags 706a to 706c to the repair flag flip-flops 701a to 701c. Specifically, the data transfer control circuit 403 supplies the clock signal CK1 with the same number of pulses as the number 1301 of repair flags to the repair flag flip-flops 701a to 701c to serially transfer the repair flags 706a to 706c with three bits to the three repair flag flip-flops 701a to 701c.

Even if the number of repair flags 706a to 706c is changed along with a change in the number of redundant memories during the design, the number of the repair flags 706a to 706c can be determined based on the number 1301 of repair flags in the non-volatile memory 404 to serially transfer the repair flags 706a to 706c. As a result, the configurations of the non-volatile memory 404 and the data transfer control circuit 403 do not have to be changed, and there is an advantage that the non-volatile memory 404 and the data transfer control circuit 403 can be used as macros.

Fifth Embodiment

FIG. 14 depicts a configuration example of a memory device according to a fifth embodiment. Differences from the first and second embodiments in the present embodiment will be described. In the present embodiment, the frequency of the clock signal CK1 can be high. The delay time is long if the length of a bypass line connecting an output terminal of the data transfer control circuit 403 and an input terminal of the first selector 705a as well as a bypass line connecting an output terminal of the first selector 705a and an input terminal of the second selector 705b are long. Therefore, the frequency of the clock signal CK1 needs to be low. In the present embodiment, a first bypass flip-flop 1401a and a second bypass flip-flop 1401b are arranged to make the frequency of the clock signal CK1 high.

The first bypass flip-flop 1401a is a flip-flop that is connected between the output terminal of the data transfer control circuit 403 and the input terminal of the first selector 705a and that is for storing the repair data stored in the non-volatile memory 404. The second bypass flip-flop 1401b is a flip-flop that is connected between the output terminal of the first selector 705a and the input terminal of the second selector 705b and that is for storing the repair data stored in the non-volatile memory 404.

The non-volatile memory 404 stores second dummy repair data 1402b when the normal memory cell blocks of the second redundant memory 401b are not switched to the redundant memory cell block 520. The second dummy repair data 1402b is stored between the first repair data 704a and the third repair data 704c. The non-volatile memory 404 stores the dummy repair data instead of the repair data 704a when the normal memory cell blocks of the first redundant memory 401a are not switched to the redundant memory cell block 520. The dummy repair data 1402b may indicate "0" or may indicate "1".

The data transfer control circuit 403 serially outputs the third repair data 704c, the dummy repair data 1402b, and the first repair data 704a to the first logic circuit 702a and the first bypass flip-flop 1401a.

The first selector 705a outputs the repair data stored in the first bypass flip-flop 1401a or the repair data stored in the first repair data flip-flop group 703a according to the first repair flag 706a stored in the first repair flag flip-flop 701a. Specifically, the first selector 705a outputs the repair data stored in the first repair data flip-flop group 703a when the first repair flag 706a indicates "1" and outputs the repair data stored in the first bypass flip-flop 1401a when the first repair flag 706a indicates "0".

The second selector 705b outputs the repair data stored in the second bypass flip-flop 1401b or the repair data stored in the second repair data flip-flop group 703b according to the second repair flag 706b stored in the second repair flag flip-flop 701b. Specifically, the second selector 705b outputs the repair data stored in the second repair data flip-flop group 703b when the second repair flag 706b indicates "1" and outputs the repair data stored in the second bypass flip-flop 1401b when the second repair flag 706b indicates "0".

The data transfer control circuit 403 supplies the clock signal CK1 with three pulses to the repair flag flip-flops 701a to 701c to serially transfer the repair flags 706a to 706c to the repair flag flip-flops 701a to 701c. Subsequently, the data transfer control circuit 403 can supply the clock signal CK1 with eight pulses to the repair data flip-flop groups 703a to 703c as well as to the bypass flip-flops 1401a and 1401b to serially transfer the repair data 704a to 704c to the repair data flip-flop groups 703a to 703c. The first repair data 704a is set to the first repair data flip-flop group 703a. The second repair data 704b is set to the second repair data flip-flop group 703b. The third repair data 704c is set to the third repair data flip-flop group 703c. The dummy repair data 1402b is stored in the second bypass flip-flop 1401b.

According to the present embodiment, the bypass flip-flops 1401a and 1401b can be arranged to reduce the length of the bypass line to reduce the delay time. Therefore, the frequency of the clock signal CK1 during the data transfer can be high.

Sixth Embodiment

Figure 15:
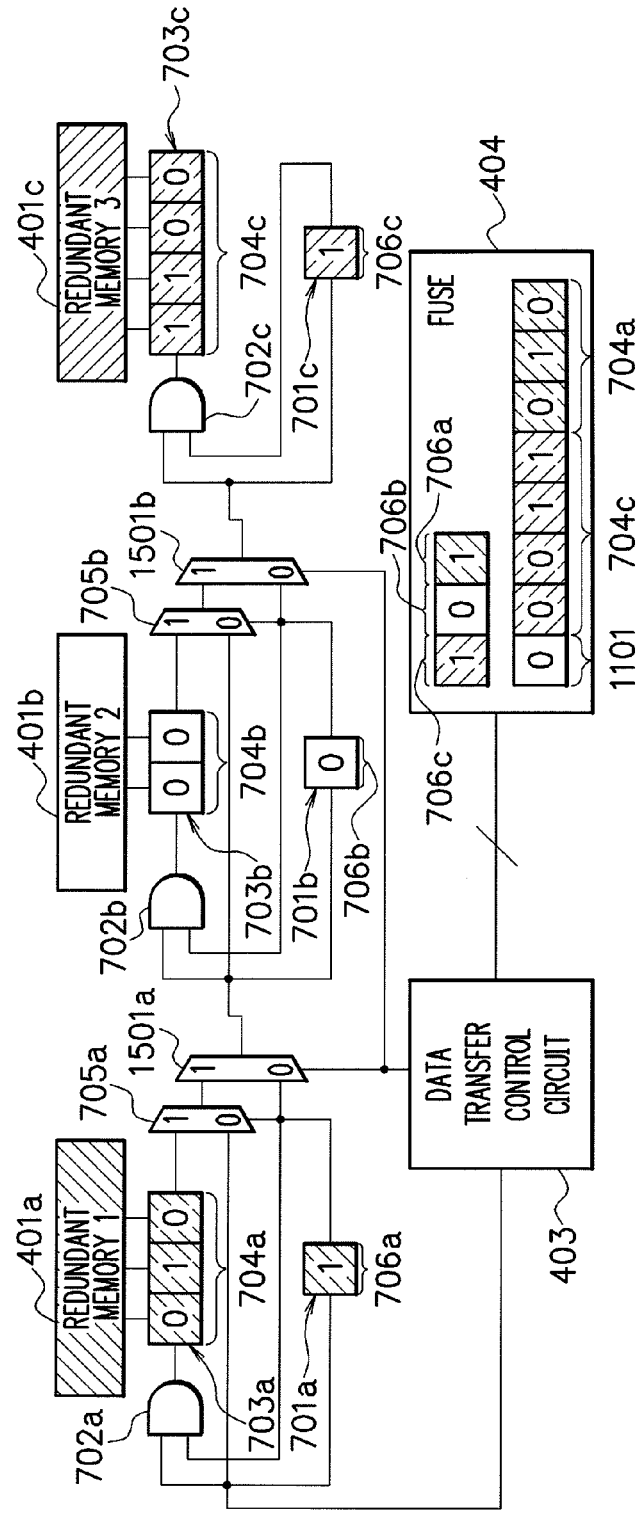
FIG. 15 depicts a configuration example of a memory device according to a sixth embodiment.

FIG. 15 depicts a configuration example of a memory device according to a sixth embodiment. Differences from the first and second embodiments in the present embodiment will be described. The memory device of FIG. 7 includes two lines connecting the repair data acquisition circuits 402a and 402b and two lines connecting the repair data acquisition circuits 402b and 402c. In the present embodiment, the number of the connecting lines is reduced to facilitate changing the connection between the repair data acquisition circuits 402a to 402c.

A selector 1501a outputs the repair flag stored in the first repair flag flip-flop 701a or the repair data output by the first selector 705a to the second repair flag flip-flop 701b, the second selector 705b, and the second logic circuit 702b according to the control by the data transfer control circuit 403. The first repair flag flip-flop 701a is connected between the output terminal of the data transfer control circuit 403 and an input terminal of the selector 1501a.

A selector 1501b outputs the repair flag stored in the second repair flag flip-flop 701b or the repair data output by the second selector 705b to the third repair flag flip-flop 701c and the third logic circuit 702c according to the control by the data transfer control circuit 403. The second repair flag flip-flop 701b is connected between an output terminal of the selector 1501a and an input terminal of the selector 1501b.

Figure 16:
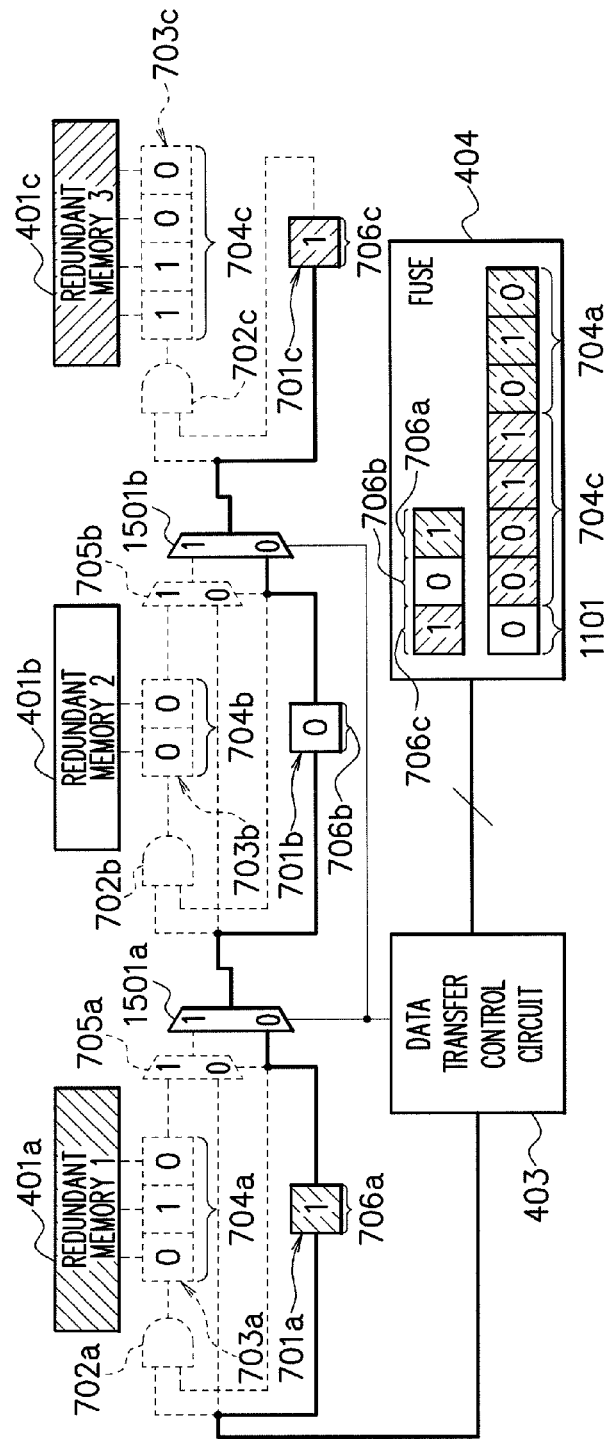
FIG. 16 depicts serial transfer of the repair flags to the repair flag flip-flops.
Figure 17:
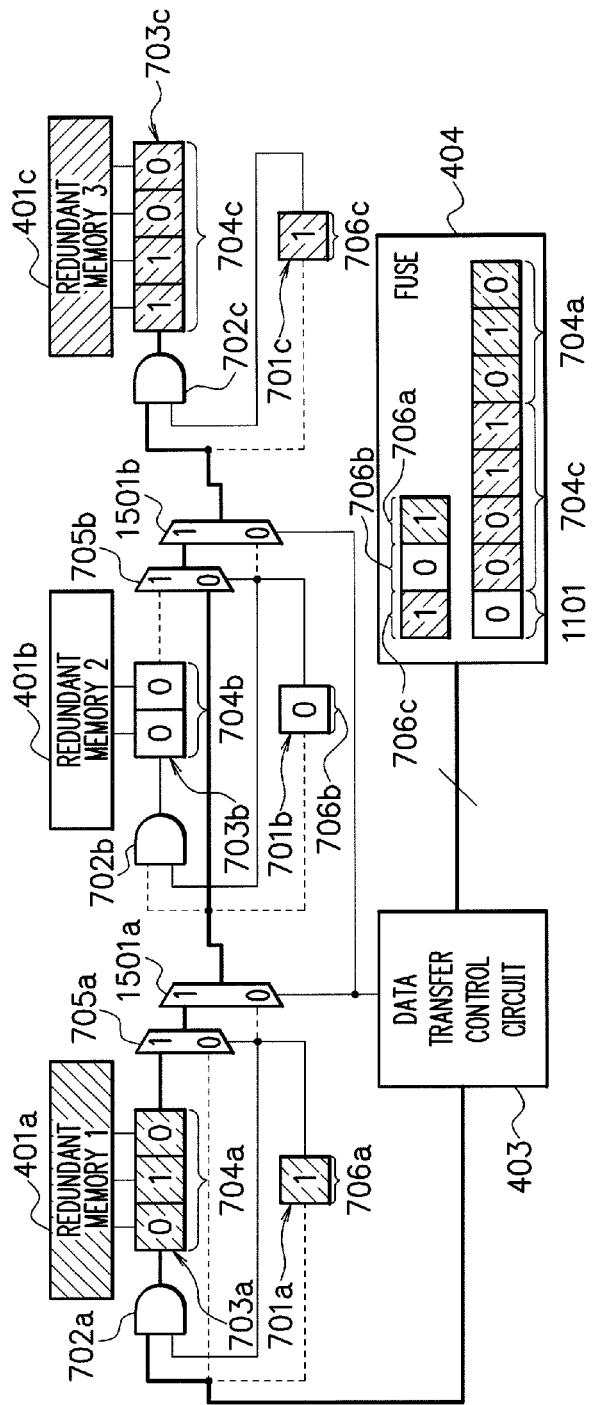
FIG. 17 depicts serial transfer of the repair data to the repair data flip flop groups.

FIG. 16 depicts serial transfer of the repair flags 706a to 706c to the repair flag flip-flops 701a to 701c. FIG. 17 depicts serial transfer of the repair data 704a to 704c to the repair data flip-flop groups 703a to 703c.

A process of serially transferring the repair flags 706a to 706c to the repair flag flip-flops 701a to 701c will be described with reference to FIG. 16. The data transfer control circuit 403 outputs a selection signal of "0" to the selectors 1501a and 1501b. As a result, the selector 1501a selects the repair flag stored in the first repair flag flip-flop 701a and outputs the repair flag to the second repair flag flip-flop 701b. The selector 1501b selects the repair flag stored in the second repair flag flip-flop 701b and outputs the repair flag to the third repair flag flip-flop 701c.

The data transfer control circuit 403 supplies the clock signal CK1 with three pulses to the repair flag flip-flops 701a to 701c and serially outputs the repair flags 706c, 706b, and 706a in the non-volatile memory 404 to the first repair flag flip-flop 701a. Consequently, the third repair flag 706c is set to the third repair flag flip-flop 701c. The second repair flag 706b is set to the second repair flag flip-flop 701b. The first repair flag 706a is set to the first repair flag flip-flop 701a.

A process of serially transferring the repair data 704a to 704c to the repair data flip-flop groups 703a to 703c will be described with reference to FIG. 17. Subsequently, the data transfer control circuit 403 outputs a selection signal of "1" to the selectors 1501a and 1501b. As a result, the selector 1501a selects the repair data output by the first selector 705a and outputs the repair data to the second selector 705b. The selector 1501b selects the repair data output by the second selector 705b and outputs the repair data to the third logic circuit 702c.

The data transfer control circuit 403 outputs the clock signal CK1 with eight pulses corresponding to the repair data 1101, 704c, and 704b with eight bits in the non-volatile memory 404 to the repair data flip-flop groups 703a to 703c. Meanwhile, the clock signal of the repair flag flip-flops 701a to 701c is terminated. As in the second embodiment, the third repair data 704c is set to the third repair data flip-flop group 703c. The second repair data 704b is set to the second repair data flip-flop group 703b. The first repair data 704a is set to the first repair data flip-flop group 703a.

According to the present embodiment, there is one line connecting the repair data acquisition circuits 402a and 402b, and there is one line connecting the repair data acquisition circuits 402b and 402c. The number of the connecting lines can be reduced, and the connection between the repair data acquisition circuits 402a to 402c can be easily changed.

Figure 3:
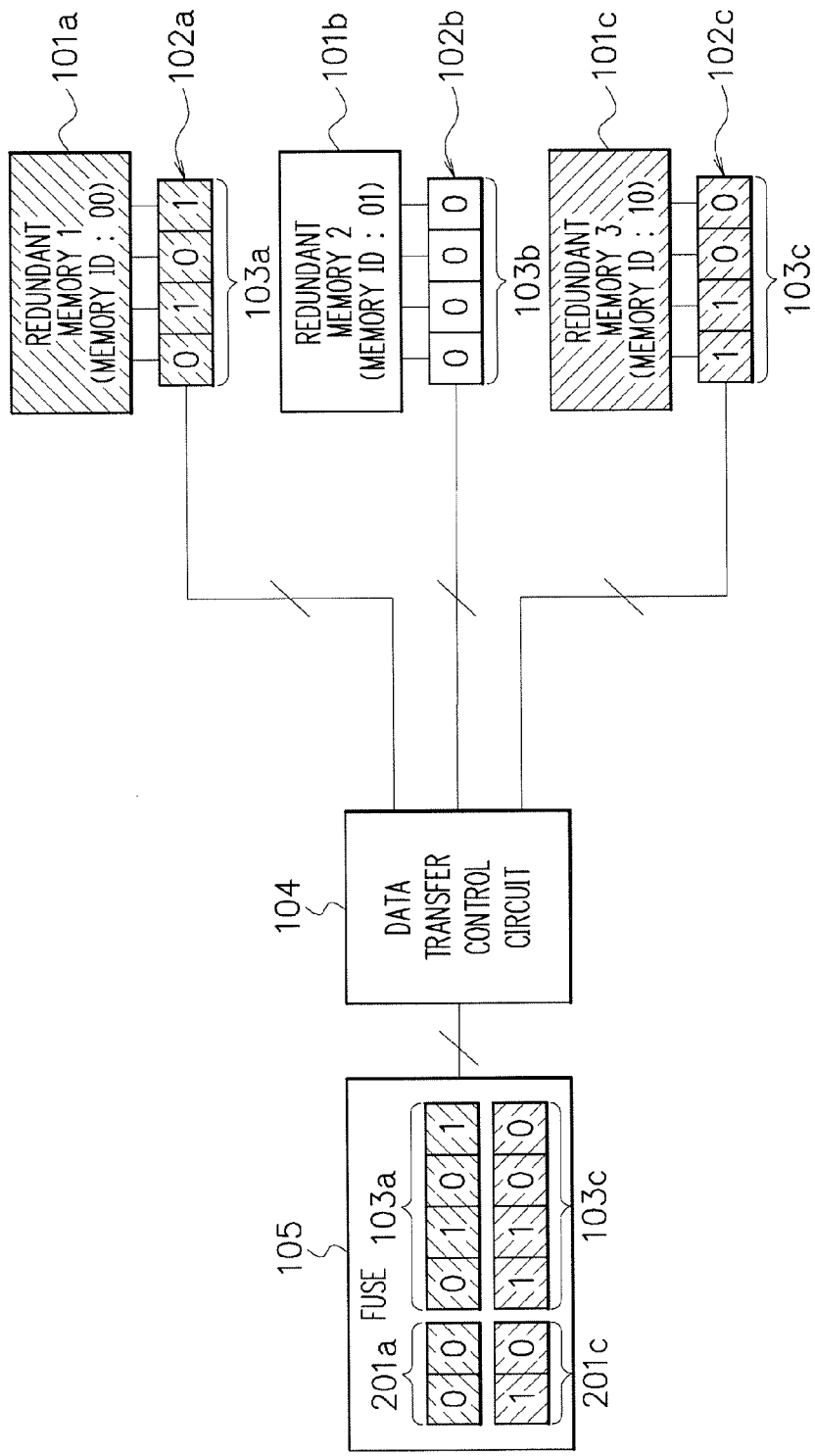
FIG. 3 depicts a configuration example of yet another memory device.

As described, the first to sixth embodiments can reduce the data transfer time compared to the memory device of FIG. 1 and the memory device of FIG. 2. The first to sixth embodiments can reduce the number of parallel connection wires between the data transfer control circuit and the flip-flop groups compared to the memory device of FIG. 3.

The embodiments are intended to illustrate examples for implementing the present invention and should not be construed as limiting the technical scope of the present invention. The present invention can be implemented in various forms without departing from the technical concept and main features of the present invention.

The number of parallel connection wires can be reduced, and the data transfer time can be reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A memory device comprising:
a first redundant memory that includes a plurality of normal memory cell blocks and a redundant memory cell block;
a second redundant memory that includes a plurality of normal memory cell blocks and a redundant memory cell block;
a non-volatile memory that stores a first repair flag, a second repair flag, and repair data;
a first repair flag flip-flop that stores the first repair flag stored in the non-volatile memory;
a first repair data flip-flop group that stores repair data;
a second repair flag flip-flop that is connected in series to the first repair flag flip-flop and that stores the second repair flag stored in the non-volatile memory;
a second repair data flip-flop group that can be connected to the first repair flag flip-flop and that stores repair data; and
a data transfer control circuit that supplies a clock signal to the first repair flag flip-flop, the second repair flag flip-flop, the first repair data flip-flop group, and the second repair data flip-flop group to serially transfer the second repair flag and the first repair flag stored in the non-volatile memory to the second repair flag flip-flop and the first repair flag flip-flop, and subsequently, serially outputs the repair data stored in the non-volatile memory to the first repair data flip-flop group and serially transfers the repair data of the first repair data flip-flop group and the second repair data flip-flop group, wherein
the first redundant memory switches one of the plurality of normal memory cell blocks to the redundant memory cell block according to the repair data stored in the first repair data flip-flop group, and
the second redundant memory switches one of the plurality of normal memory cell blocks to the redundant memory cell block according to the repair data stored in the second repair data flip-flop group.

2. The memory device according to claim 1, further comprising:
a first logic circuit that outputs the repair data stored in the non-volatile memory or repair data as a fixed value according to the first repair flag stored in the first repair flag flip-flop;
a first selector that outputs the repair data stored in the non-volatile memory or the repair data stored in the first repair data flip-flop group according to the first repair flag stored in the first repair flag flip-flop; and
a second logic circuit that outputs the repair data output by the first selector or the repair data as a fixed value according to the second repair flag stored in the second repair flag flip-flop, wherein
the non-volatile memory stores the first repair flag indicating whether to switch the normal memory cell blocks of the first redundant memory to the redundant memory cell block, the second repair flag indicating whether to switch the normal memory cell blocks of the second redundant memory to the redundant memory cell block, and the repair data indicating which one of the plurality of normal memory cell blocks in the first redundant memory and/or the second redundant memory for switching the normal memory cell blocks to the redundant memory cell block is to be switched to the redundant memory cell block,
the first repair data flip-flop group stores the repair data output by the first logic circuit,
the second repair data flip-flop group stores the repair data output by the second logic circuit,
the data transfer control circuit supplies a clock signal to the first repair flag flip-flop, the second repair flag flip-flop, the first repair data flip-flop group, and the second repair data flip-flop group to serially transfer the second repair flag and the first repair flag stored in the non-volatile memory to the second repair flag flip-flop and the first repair flag flip-flop, and subsequently, serially outputs the repair data stored in the non-volatile memory to the first logic circuit and serially transfers the repair data of the first repair data flip-flop group and the second repair data flip-flop group,
the first redundant memory does not switch the normal memory cell blocks to the redundant memory cell block when the repair data stored in the first repair data flip-flop group is the repair data as a fixed value, and the second redundant memory does not switch the normal memory cell blocks to the redundant memory cell block when the repair data stored in the second repair data flip-flop group is the repair data as a fixed value.

3. The memory device according to claim 2, wherein
the non-volatile memory stores first dummy repair data and the repair data of the first redundant memory and/or the second redundant memory, and
the data transfer control circuit serially outputs the first dummy repair data to the first logic circuit, and subsequently, serially outputs the repair data of the first redundant memory and/or the second redundant memory to the first logic circuit.

4. The memory device according to claim 2, further comprising
a third redundant memory that includes a plurality of normal memory cell blocks and a redundant memory cell block, wherein
the first redundant memory switches one of the plurality of normal memory cell blocks to the redundant memory cell block according to data of a part of the repair data stored in the first repair data flip-flop group, and
the third redundant memory switches one of the plurality of normal memory cell blocks to the redundant memory cell block according to data of another part of the repair data stored in the first repair data flip-flop group.

5. The memory device according to claim 2, wherein
the non-volatile memory stores the number of repair flags and repair flags including the first repair flag and the second repair flag, and
the data transfer control unit reads out the repair flags including the first repair flag and the second repair flag from the non-volatile memory according to the number of repair flags stored in the non-volatile memory to serially transfer the repair flags to the second repair flag flip-flop and the first repair flag flip-flop.

6. The memory device according to claim 2, further comprising
a first bypass flip-flop that stores the repair data stored in the non-volatile memory, wherein
the non-volatile memory stores second dummy repair data when the normal memory cell blocks of the first redundant memory are not switched to the redundant memory cell block,
the data transfer control circuit serially outputs the repair data and/or the second dummy repair data to the first logic circuit and the first bypass flip-flop, and
the first selector outputs the repair data stored in the first bypass flip-flop or the repair data stored in the first repair data flip-flop group according to the first repair flag stored in the first repair flag flip-flop.

7. The memory device according to claim 2, further comprising
a second selector that outputs the repair flag stored in the first repair flag flip-flop or the repair data output by the first selector to the second repair flag flip-flop and the second logic circuit, wherein
the data transfer control circuit controls the second selector to output the repair flag stored in the first repair flag flip-flop when serially transferring the second repair flag and the first repair flag stored in the non-volatile memory to the second repair flag flip-flop and the first repair flag flip-flop, and subsequently, controls the second selector to output the repair data output by the first selector when serially outputting the repair data stored in the non-volatile memory to the first logic circuit.

8. The memory device according to claim 2, wherein
the number of flip-flops in the first repair data flip-flop group and the number of flip-flops in the second repair data flip-flop group are different.

* * * * *